(12) United States Patent
Taira et al.

(10) Patent No.: US 6,395,658 B1
(45) Date of Patent: May 28, 2002

(54) CERAMIC COMPOSITION AND CERAMIC ELECTRIC DEVICE

(75) Inventors: Hiroaki Taira, Izumo; Yasutaka Sugimoto, Kyoto, both of (JP)

(73) Assignee: Murata Manufacturing Co., Ltd. (JP)

( * ) Notice: Subject to any disclaimer, the term of this patent is extended or adjusted under 35 U.S.C. 154(b) by 42 days.

(21) Appl. No.: 09/679,017

(22) Filed: Oct. 4, 2000

(30) Foreign Application Priority Data

Oct. 7, 1999 (JP) .......................................... 11-286382

(51) Int. Cl.$^7$ ............................................. C04B 35/495
(52) U.S. Cl. ...................... 501/32; 501/135; 428/426; 428/433; 428/434
(58) Field of Search .................. 501/32, 135; 428/426, 428/433, 434

(56) References Cited

FOREIGN PATENT DOCUMENTS

JP          845347          2/1996

*Primary Examiner*—David Brunsman
(74) *Attorney, Agent, or Firm*—Ostrolenk, Faber, Gerb & Soffen, LLP

(57) ABSTRACT

A dielectric ceramic composition having a high dielectric constant. The dielectric ceramic composition is sinterable at a low sintering temperature and has superior electrical and temperature characteristics. The dielectric ceramic composition comprises 100 parts by weight of a dielectric ceramic component represented by the general formula $Ba\{(Co_x Zn_{1-x})_y Nb_{1-y}\}_z O_w$, in which, on a molar basis, $0<x<1$, $0.313 \leq y < 0.333$, $0.993 \leq z < 1$, and w is an optional number, and 1 to 25 parts by weight of a $SiO_2$—$B_2O_3$-based glass component is mixed therewith.

17 Claims, 3 Drawing Sheets

CERAMIC COMPOSITION AND CERAMIC ELECTRIC DEVICE

BACKGROUND OF THE INVENTION

1. Field of the Invention

The present invention relates to dielectric ceramic compositions having high dielectric constants and ceramic electronic devices using the dielectric ceramic compositions as dielectric layers.

2. Description of the Related Art

Recently, significant improvements have been made in the performance of electronic devices. In particular, in information processing apparatus such as computers, mobile communication terminals, and the like which have led the new, information-oriented society, higher processing speeds, miniaturization, enhanced multifunctionality, and the like have been actively pursued. Highly integrated and functional semiconductor devices provided with higher processing speeds, such as VLSI and ULSI, have primarily been responsible for improvements in information processing apparatuses. However, even though the speed and performance of semiconductor devices have improved, signal delay, cross talk, impedance mismatch, noise generation due to fluctuation in power supply voltages, and the like may occur on substrates where devices are connected to each other, and hence, the system performance may be limited, that is, the potential performance of semiconductor devices is not fully exploited in some cases.

Accordingly, a so-called multichip module (MCM) has been practically used as a substrate for performing reliable information processing at a higher speed. In an MCM, a plurality of semiconductor devices are mounted on a ceramic substrate. In order to increase the mounting density of the semiconductor devices and to electrically interconnect them reliably, ceramic multilayer substrates in which conductive patterns are disposed in three-dimensional arrangements are particularly useful as MCM substrates.

Alumina has been conventionally used as an insulating material for the ceramic multilayer substrate described above. However, the baking temperature of alumina is a high temperature of not less than 1,500° C., and as a result, a high melting point metal, such as tungsten or molybdenum, must be used to make the conductors on the substrate so that simultaneous baking with alumina can be performed. In addition, the high melting point metals mentioned above are susceptible to oxidation, and hence, baking must be performed in a reducing atmosphere. Furthermore, since the high melting point metals have high resistivities, the ceramic multilayer substrate has a limitation in, particularly, its high frequency characteristics.

In general, alumina has a high relative dielectric constant of approximately 10, so that signal delay may be larger in some cases when semiconductor devices are operated at high speeds. Alumina also has a high coefficient of thermal expansion compared to that of silicon, which is frequently used for semiconductor devices, whereby degradation of reliability caused by thermal cycles may occur in some cases.

Accordingly, in order to solve the problems described above, the use of low-temperature sinterable ceramic materials, which are composites of ceramic components and glass components, has been aggressively researched, and practical use of ceramic multilayer substrates formed of the composites mentioned above has been pursued. The low-temperature sinterable ceramic material is a material comprising a ceramic component as a mother material and a glass component as a sintering auxiliary agent. Since the low-temperature sinterable ceramic material has a low sintering temperature, freedom in material characteristics and baking temperatures can be significantly broadened. In particular, when the low-temperature sinterable ceramic material is used, a low-melting point metal, such as a copper-based, a silver-based, or a gold-based metal, each having low resistivity, can be simultaneously baked, and hence, a ceramic multilayer substrate having superior frequency characteristics can be formed.

Recently, research has been performed, in which passive devices, such as capacitors and inductors, which are constituents of devices to be mounted on substrates, are embedded in a ceramic multilayer substrate so as to realize further miniaturization of modules. However, in the case in which the passive devices are embedded in the ceramic multilayer substrate, when characteristics of the passive devices embedded in the substrate are inferior to those mounted on the surfaces of the substrate, the advantages thereof are reduced by half. Hence, the characteristics of the passive devices embedded in the substrate must be equivalent or superior to those mounted on the substrate.

Accordingly, when passive devices are embedded in the ceramic multilayer substrate, a material for the substrate is, in general, properly selected so that characteristics of the passive devices can be fully utilized. For example, portions at which capacitors are formed are composed of dielectric layers having high dielectric constants, and other portions are composed of insulating layers having high resistances, so that compact and improved ceramic multilayer substrates can be obtained.

The applicant of the present invention has disclosed a dielectric ceramic composition having a high dielectric constant which can be used in a dielectric layer, in Japanese Unexamined Patent Application Publication No. 8-45347, which is represented by the general formula $Ba\{(Co_xZn_{1-x})_yNb_{1-y}\}_zO_w$, in which, on a molar basis, $0<x<1$, $0.313 \leq y < 0.333$, $0.993 \leq z < 1$, and w is an optional number. Even though the dielectric ceramic composition is a composition obtained by baking at a high temperature of 1,420 to 1,520° C., the composition can be baked in a relatively short time and has superior electrical characteristics such that the Q value is not less than 10,000 at approximately 7 GHz.

However, since the dielectric ceramic composition described in Japanese Unexamined Patent Application Publication No. 8-45347 has a high sintering temperature of not less than 1,420° C., simultaneous baking with a low melting point metal, such as silver or copper, cannot be performed. When a glass component is added to the dielectric ceramic composition so as to decrease the baking temperature, depending on the types and amounts added, substrate strength may be significantly decreased compared to that of an alumina substrate, or its electrical characteristics and/or temperature characteristics may be significantly decreased in some cases even though the substrate strength is high.

Specifically, when substrate strength is regarded as important, the relative dielectric constant is small, so that capacitors to be embedded in the substrate are unlikely to have high capacitance. In order to provide capacitors having high capacitance, the electrode areas occupied thereby must be large, so that it is difficult to realize substrate miniaturization and to increase surface mounting densities. In contrast, when electrical characteristics and temperature characteristics are regarded as important, the mechanical strength is low, so that the reliability of the substrate may be poor if used as a substrate for mounting semiconductors and the like.

SUMMARY OF THE INVENTION

Accordingly, taking the conventional problems into consideration, the present invention provides a low-temperature sinterable dielectric ceramic composition having superior electrical and temperature characteristics and a high dielectric constant, and a ceramic electronic device using the same.

In one aspect of the present invention, there is provided a dielectric ceramic composition comprising a dielectric ceramic component represented by the general formula $Ba\{(Co_xZn_{1-x})_yNb_{1-y}\}_zO_w$, in which, on a molar basis, $0<x<1$, $0.313 \leq y 0.333$, $0.993 \leq z<1$, and w is an optional number, and a glass component comprising at least silicon oxide and boron oxide, wherein the dielectric ceramic component and the glass component are mixed.

In the dielectric ceramic composition of the present invention, 1 to 25 parts by weight of the glass component may be mixed with 100 parts by weight of the dielectric ceramic component.

In the dielectric ceramic composition of the present invention, the glass component may comprise 10 to 60 percent by weight of silicon oxide, 5 to 40 percent by weight of boron oxide, 0 to 30 percent by weight of aluminum oxide, 20 to 70 percent by weight of at least one of an alkaline earth oxide and zinc oxide, and 0 to 15 percent by weight of an alkali metal oxide.

The dielectric ceramic composition of the present invention may further comprise cerium oxide in a ratio of 0.5 parts by weight of the cerium oxide to 100 parts by weight of the dielectric ceramic component.

In another aspect of the present invention, there is provided a ceramic electronic device comprising a dielectric layer and a conductive layer provided thereon, wherein the dielectric layer is composed of the dielectric ceramic composition of the present invention.

In the ceramic electronic device of the present invention, the conductive layer comprises at least one conductive material selected from the group consisting of a copper-based, a silver-based, and a gold-based conductive material.

Since the dielectric ceramic composition of the present invention is composed of the dielectric ceramic component represented by the general formula described above and the glass component (hereinafter referred to as $SiO_2$—$B_2O_3$-based glass component) containing at least silicon oxide and boron oxide mixed with the dielectric ceramic component, a high relative dielectric constant, a small temperature coefficient of resonant frequency, and a high Q value in a high frequency region of the dielectric ceramic component can be maintained. In addition, the dielectric ceramic composition having superior electric and temperature characteristics described above can be obtained by low-temperature sintering at not more than a melting point of a low-melting point metal.

In the ceramic electronic device of the present invention having the dielectric layer provided with the conductive layer thereon, since the dielectric layer is composed of the dielectric ceramic composition of the present invention, simultaneous baking can be performed with a conductive low-melting point metal material having a low resistivity, and as a result, a ceramic electronic device can be obtained which has superior electrical and temperature characteristics, and more specifically, superior high frequency characteristics.

The above and other features and advantages of the present invention will be apparent from the following detailed description of embodiments of the invention in conjunction with the accompanying drawings in which like references denote like elements and parts.

DESCRIPTION OF EMBODIMENTS OF THE INVENTION

Figure 1:
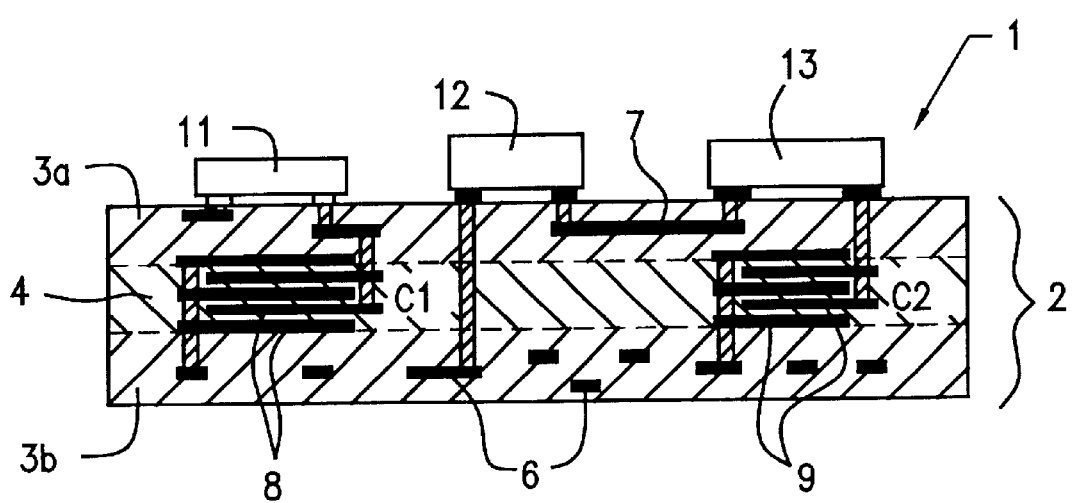
FIG. 1 is a cross-sectional view of a ceramic multilayer substrate according to a first embodiment of the present invention.

In the present invention, x, y, and z of a dielectric ceramic component represented by the general formula $Ba\{(Co_xZn_{1-x})_yNb_{1-y}\}_zO_w$ are, on a molar basis, $0<x<1$, $0.313 \leq y<0.333$, $0.993 \leq z<1$, and w is the molar proportion of oxygen. The dielectric ceramic composition having molar ratios mentioned above has, in addition to a high relative dielectric constant and a small temperature coefficient of resonant frequency, a noticeably high Q value in a high frequency region, and superior electrical and temperature characteristics.

When the x is 0 or 1 in the dielectric ceramic component, the dielectric ceramic component cannot be sintered at 1,100° C. or less even when a $SiO_2$—$B_2O_3$-based glass component is added thereto. Even when the dielectric ceramic component can be sintered, the Q value of the resultant dielectric ceramic composition is low. When the y<0.313 or y≧0.333, it is difficult to perform sintering at 1,100° C. or less even when a $SiO_2$—$B_2O_3$-based glass component is added to the dielectric ceramic component, or the Q value of the dielectric ceramic composition is significantly low even when the dielectric ceramic component can be sintered at 1,100° C. or less. In addition, when the z<0.993 and z≧1, it is difficult to perform sintering at 1,100° C. or less even when a $SiO_2$—$B_2O_3$-based glass component is added to the dielectric ceramic component, or the Q value of the dielectric ceramic composition is significantly low even when the dielectric ceramic component can be sintered at 1,100° C. or less.

In the present invention, the $SiO_2$—$B_2O_3$-based glass component primarily functions to decrease the sintering temperature of the dielectric ceramic component. When the glass component does not contain silicon oxide and boron oxide, it is difficult to perform low-temperature sintering at 1,100° C. or less. In addition, even when the dielectric ceramic component can be sintered at 1,100° C. or less, the electrical and temperature characteristics are significantly degraded, for example, the Q value of the dielectric ceramic composition is low.

In the present invention, the $SiO_2$—$B_2O_3$-based glass component is preferably mixed in a ratio of 1 to 25 parts by weight thereof to 100 parts by weight of the dielectric ceramic component. When the mixed amount of the $SiO_2$—$B_2O_3$-based glass component is less than 1 part by weight, it is difficult to perform sintering at 1,100° C. or less.

Conversely, when the mixed amount thereof is more than 25 parts by weight, the Q value of the dielectric ceramic composition tends to decrease.

The $SiO_2$—$B_2O_3$-based glass component of the present invention preferably comprises compounds shown in parentheses below as its oxide basis. They are 10 to 60 percent by weight of silicon oxide ($SiO_2$), 5 to 40 percent by weight of boron oxide ($B_2O_3$), 0 to 30 percent by weight of aluminum oxide ($Al_2O_3$), 20 to 70 percent by weight of an alkaline earth oxide and/or zinc oxide (ZnO), and 0 to 15 percent by weight of an alkali metal oxide.

In the glass component, when the content of $SiO_2$ is less than 10 percent by weight, the humidity resistance and the Q value of the resultant dielectric ceramic composition tend to decrease. On the other hand, when the content of $SiO_2$ is more than 60 percent by weight, the softening temperature of the glass component is high, and the sintering characteristics are degraded when the glass component is added, whereby it is difficult to perform simultaneous sintering at 1,000° C. or less, at which temperature the Ag-based conductive material can be simultaneously sintered.

When the content of $B_2O_3$ is less than 5 percent by weight, the softening temperature of the glass component is too high, and as a result, the sintering characteristics may be degraded in some cases. On the other hand, when the content of $B_2O_3$ is more than 40 percent by weight, the humidity resistance of the dielectric ceramic composition tends to be degraded.

$Al_2O_3$ need not be added to the dielectric ceramic component at all, and when the content thereof is more than 30 percent by weight, the softening temperature of the glass component is high, and as a result, the sintering characteristics tends to be degraded.

When the content of an alkaline earth oxide (MgO, CaO, SrO, BaO, and the like) and/or zinc oxide is less than 20 percent by weight, the softening temperature of the glass component is too high, and as a result, the sintering characteristics may be degraded in some cases. On the other hand, when the content thereof is more than 70 percent by weight, the humidity resistance and the Q value of the dielectric ceramic composition tend to decrease.

In order to further realize low-temperature sintering for the dielectric ceramic component, it is effective to add an alkali metal oxide ($Li_2O$, $Na_2O$, $K_2O$, and the like) to the glass component. However, when the content of the alkali metal oxide is more than 15 percent by weight, the humidity resistance and the Q value of the dielectric ceramic composition tends to decrease.

In the present invention, not more than 0.5 part by weight of cerium oxide to 100 parts by weight of the dielectric ceramic component is preferably contained therein. When a small amount of cerium oxide ($CeO_2$) is added, the Q value is improved. However, when the amount added is more than 0.5 part by weight to 100 parts by weight of the dielectric ceramic component, the Q value tends to decrease.

According to the dielectric ceramic composition described above, since a molded object formed of a powdered mixture (powdered glass ceramic mixture) thus described can be baked at 900 to 1,100° C., a low-melting point metal having a low resistivity which is relatively inexpensive, such as a silver-based or a copper-based metal, can be simultaneously sintered with the powdered mixture. In addition, a dielectric ceramic composition having superior electrical characteristics can be obtained, in which the relative dielectric constant $\in r$ is approximately not less than 30, and the Q value is approximately not less than 1,000.

In the ceramic electronic device of the present invention, the conductive layer is preferably composed of at least one of a low-melting point metal material of a copper-based ((Cu, CuO, $Cu_2O$, and the like), a silver-based (Ag, Ag—Pt, Ag—Pd, and the like), and a gold-based (Au and the like) material. Each metal material mentioned above is available at relatively low cost, has low resistivity, and particularly, has superior characteristics in a high frequency region.

The ceramic electronic device of the present invention may comprise the dielectric layer provided on an insulating layer. That is, the ceramic electronic device of the present invention can be applied to a ceramic multilayer substrate, for example, in which a dielectric layer having capacitors and the like is provided on an insulating layer (such as an insulating substrate).

In this case, the insulating layer is preferably composed of a low-temperature sinterable ceramic composition which can be simultaneously baked with the low-melting point metal described above. The low-temperature sinterable ceramic composition mentioned above may be composed of, for example, $Mg_2Al_2O_4$ and the like added with $B_2O_3$, MgO, $SiO_2$, and the like, and may be primarily composed of MgO, $Al_2O_3$, and $SiO_2$. In addition, the low-temperature sinterable ceramic composition may be composed of a powdered alumina ceramic added with CaO—$Al_2O_3$—$SiO_2$-based glass.

Next, ceramic electronic devices according to embodiments of the present invention will be described with reference to the figures.

First Embodiment

As shown in FIG. 1, a ceramic electronic device according to an embodiment of the invention is a ceramic multilayer module 1 having a ceramic multilayer substrate 2 as a base and devices 11, 12, and 13, such as semiconductor devices, mounted on the ceramic multilayer substrate 2.

The ceramic multilayer substrate 2 has the structure having a dielectric layer 4 composed of the dielectric ceramic composition of the present invention provided between insulating layers 3a and 3b, and capacitors C1 and C2 formed by internal electrodes 8 and 9, respectively, are embedded in the dielectric layer 4 composed of the dielectric ceramic composition of the present invention. In addition, internal wirings 6 and 7 are formed in the insulating layers 3a and 3b, and the internal wirings 6 and 7 electrically connect the mounted devices 11 to 13, the capacitors C1 and C2, external terminals, and the like.

Next, a method for manufacturing the ceramic multilayer substrate 2 will be described.

As a material for the insulating layers 3a and 3b, for example, powdered alumina ceramic and powdered glass primarily composed of MgO—$B_2O_3$—$SiO_2$ are prepared, and then, 20 to 30 parts by weight of the powdered glass is added to and mixed with 100 parts by weight of the powdered alumina ceramic. Then, a resultant powdered mixture is added to appropriate amounts of an organic binder, a dispersing agent, a plasticizer, an organic solvent, and the like, and is mixed, thereby preparing a slurry for the insulating layer. Subsequently, the slurry for the insulating layer is formed into a sheet by a doctor blade method or the like, so that a ceramic green sheet for the insulating layer is obtained.

In the meantime, after preparing the powdered dielectric ceramic as a material for the dielectric layer 4 having a high dielectric constant, the powdered dielectric ceramic is baked at 1,000° C. for not less than 1 hour. Subsequently, after pulverizing the baked powdered dielectric ceramic thus formed, a glass ceramic mixture is prepared by mixing a $SiO_2$—$B_2O_3$-based glass component with the baked powdered dielectric ceramic, and the glass ceramic mixture is added to appropriate amounts of an organic vehicle, a dispersing agent, a plasticizer, an organic solvent and the like, and is then mixed, whereby a slurry for the dielectric layer is prepared. Subsequently, the slurry for the dielectric layer is formed into a sheet by a doctor blade method or the like, so that a ceramic green sheet for the dielectric layer is obtained.

When necessary, openings for use as via holes are formed in the ceramic green sheets for the insulating layer and the ceramic green sheets for the dielectric layer thus obtained, and the via holes are formed by filling paste or conductive powder into the openings. In addition, conductive paste is printed on the green sheets for the dielectric layer, which are to be formed as the capacitors 1 and 2, and when necessary, conductive patterns are formed on the green sheets for the insulating layers. Subsequently, the green sheets for the dielectric layer and the green sheets for the insulating layers are laminated.

Then, the laminated green sheets thus formed are pressed, thereby yielding a laminated block. When necessary, the laminated block may be cut to appropriate size, or a groove may be formed therein. Then the laminated block is baked at 1,000° C. or less, whereby the ceramic multilayer substrate 2 is obtained which has the capacitors C1, C2, and the like embedded therein as shown in FIG. 1.

Alternatively, the dielectric layer 4 may be formed by the steps of dispersing a glass ceramic mixture of the dielectric ceramic component mixed with $SiO_2$—$B_2O_3$-based glass in an organic vehicle, an organic solvent, a plasticizer, or the like so as to form a paste, and printing the resultant dielectric paste in areas at which the dielectric layer 4 is to be formed. In this case, after forming the dielectric layer, the ceramic multilayer substrate can be formed by lamination of the green sheets followed by pressing, cutting, baking, and the like.

As described above, in the ceramic multilayer substrate 2 according to the embodiment, miniaturization of the substrate is achieved since the capacitors are embedded therein, and capacitors having large capacitance can be formed by using relatively small electrode patterns since the dielectric layer 4 having a high dielectric constant is provided between the electrodes forming the capacitors.

In addition, since the dielectric layer 4 is formed of the dielectric ceramic composition of the present invention, the ceramic multilayer substrate 2 having superior electrical characteristics, temperature characteristics, and the like can be formed, in which superior characteristics of the dielectric ceramic component are fulfilled, for example, the temperature coefficient of resonant frequency, the relative dielectric constant, the Q value, and the like.

In addition, by adding a glass component to the insulating layers 3a and 3b, having has a composition equivalent to that of the $SiO_2$—$B_2O_3$-based glass component forming the dielectric layer 4, cohesion characteristics between the dielectric layer 4 and the insulating layers 3a and 3b can be further improved.

Second Embodiment

Figure 2:
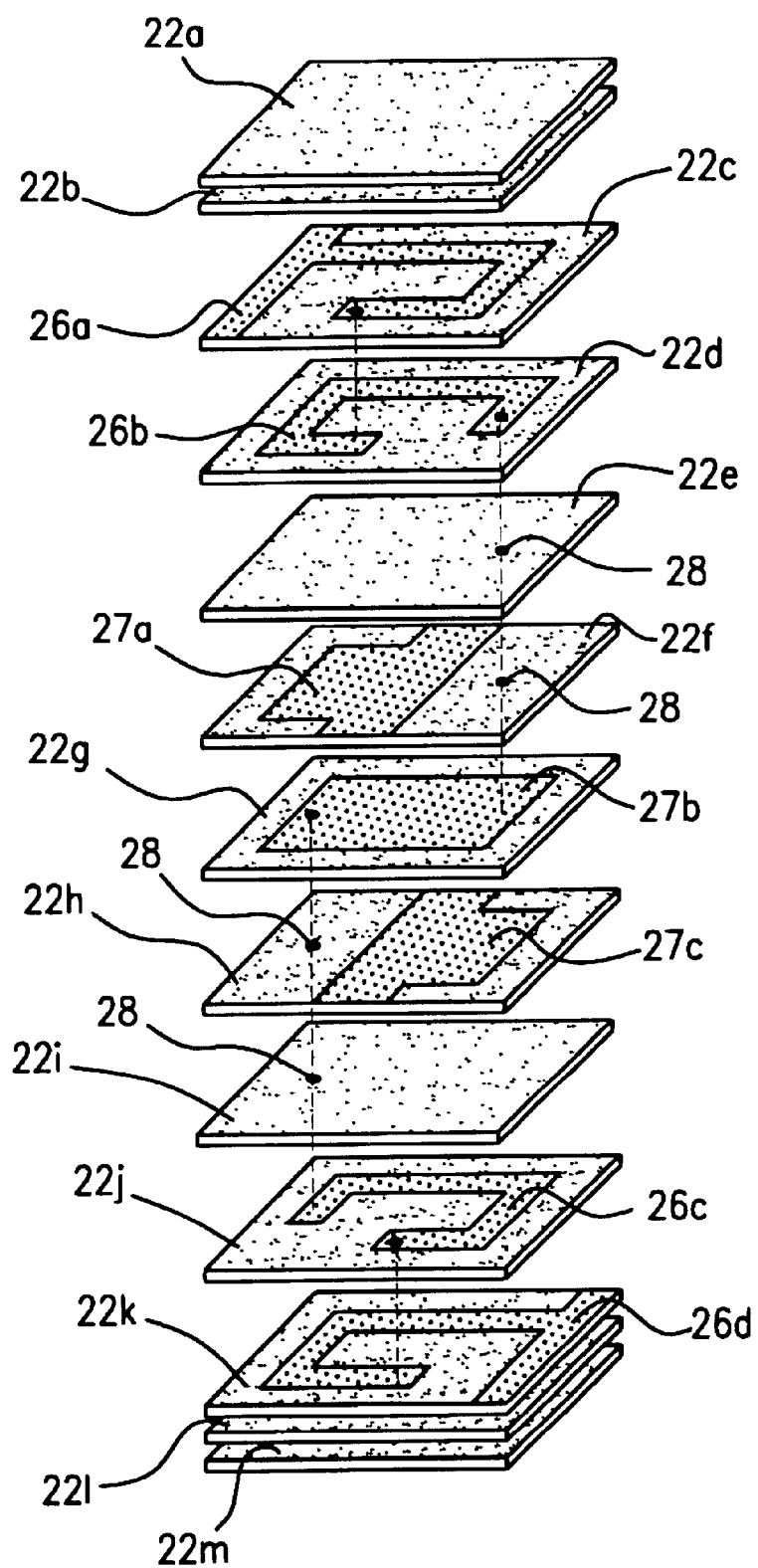
FIG. 2 is an exploded perspective view of an LC filter according to a second embodiment of the present invention.
Figure 3:
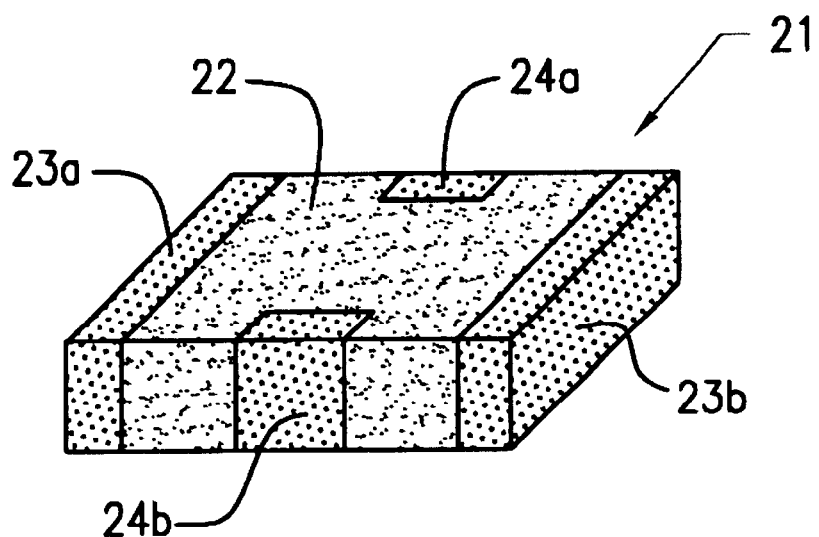
FIG. 3 is a perspective view of the LC filter according to the second embodiment of the present invention.
Figure 4:
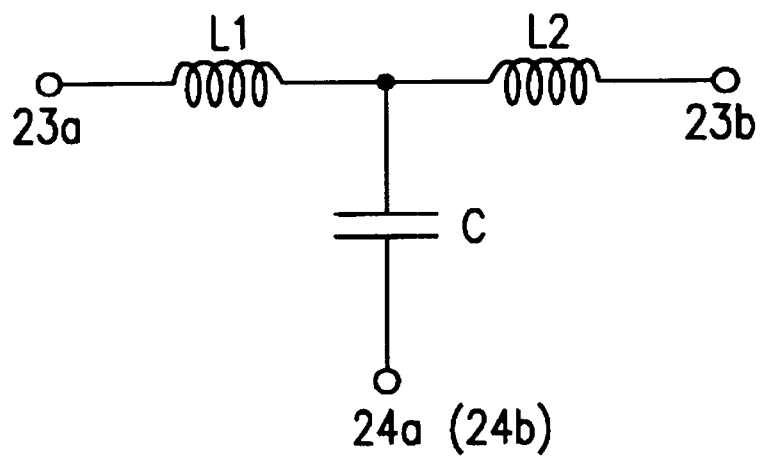
FIG. 4 is an equivalent circuit of the LC filter according to the second embodiment of the present invention.

As shown in FIGS. 2 to 4, a ceramic electronic device according to a second embodiment of the invention is an LC filter 21 having coil patterns 26a, 26b, 26c and 26d, and capacitor patterns 27a, 27b, and 27c formed in a dielectric layer 22 composed of the dielectric ceramic composition of the present invention.

The LC filter 21 can be formed by, for example, the following steps. A powdered glass ceramic mixture is prepared by mixing the dielectric ceramic component with a $SiO_2$—$B_2O_3$-based glass component, and a slurry composition is then prepared by adding an organic vehicle to the powdered glass ceramic mixture thus obtained. Then, by using the slurry composition thus obtained, a ceramic green sheet having a thickness of, for example, 40 μm is formed by a casting method or the like. Subsequently, after drying, the ceramic green sheet is cut to predetermined size, so that green sheets 22a to 22m for the dielectric layer are prepared.

Next, as shown in FIG. 2, when necessary, via holes 28 are formed in the ceramic green sheets 22a to 22m for the dielectric layer, and then, after screen-printing conductive paste so as to form the patterns 26a and 26b for a coil L1, the patterns 27a to 27c for a capacitor C, and the patterns 26c and 26d for a coil L2, the ceramic green sheets 22a to 22m are laminated and pressed, whereby a laminated block is formed.

The laminated block is then baked at 1,000° C. or less for approximately 2 hours. External electrodes 23a, 23b, 24a, and 24b are formed on edge surfaces of the baked laminated block thus obtained, whereby, as shown in FIGS. 2 and 3, the LC filter 21 having the capacitor C and the coils L1 and L2 embedded therein is formed. In this connection, the LC filter 21 has an equivalent circuit as shown in FIG. 4.

In the LC filter 21 of this embodiment, the laminated block 22 is formed of the dielectric ceramic composition of the present invention having a small temperature coefficient of resonant frequency, a high relative dielectric constant, and a high Q value. Accordingly, the LC filter 21 has superior electric and temperature characteristics. In addition, when the capacitor patterns and the coil patterns are formed of a low-melting point metal, such as a silver-based metal, an LC filter also having superior high frequency characteristics can be formed.

Heretofore, the present invention has been described with reference to a ceramic multilayer module and an LC filter. However, the present invention is not limited to the embodiments described above. For example, the ceramic electronic device of the present invention may be a ceramic electronic device ceramic multilayer substrates used as substrates for multichip modules, hybrid ICs, and the like, and a ceramic multilayer module in which devices such as laminated chip capacitor, or a chip ceramic electronic device such as a chip antenna, for example, are mounted on the ceramic multilayer substrate as described above.

EXAMPLES

Hereinafter, particular examples of the present invention will be described.

As starting materials for a glass component, $BaCO_3$, $SrCO_3$, $CaCO_3$, $MgCO_3$, ZnO, $Al_2O_3$, $Li_2CO_3$, $Na_2CO_3$, $K_2CO_3$, SiO2, and $B_2O_3$ were prepared, and these were mixed so as to be mixtures having compositions shown in Tables 1 and 2 below. Then, after melting the mixtures of starting materials thus obtained at 1,400 to 1,600° C. in a Pt—Rh crucible, the mixtures were quenched and then pulverized, whereby powdered glasses represented by glass numbers G1 to G35 in Tables 1 and 2 were obtained.

TABLE 1

| Glass # | $SiO_2$ | $B_2O_3$ | $Al_2O_3$ | Alkali metal oxide ||| | Alkaline earth oxide ||| MgO | ZnO |
| --- | --- | --- | --- | --- | --- | --- | --- | --- | --- | --- | --- | --- |
| | | | | $K_2O$ | $Li_2O$ | $Na_2O$ | PbO | BaO | SrO | CaO | | |
| G1  | 32 | 37 | —  | 3  | —  | —  | —  | —  | —  | 28 | —  | —  |
| G2  | 55 | —  | 5  | 2  | —  | —  | —  | —  | —  | 38 | —  | —  |
| G3  | 48 | —  | 10 | —  | 2  | —  | —  | —  | —  | 40 | —  | —  |
| G4  | 25 | 20 | —  | —  | 10 | —  | —  | —  | —  | 45 | —  | —  |
| G5  | —  | 40 | 20 | 20 | —  | —  | 20 | —  | —  | —  | —  | —  |
| G6  | 5  | 30 | —  | —  | 2  | —  | —  | —  | —  | 63 | —  | —  |
| G7  | 10 | 25 | —  | —  | 4  | —  | —  | 61 | —  | —  | —  | —  |
| G8  | 60 | 10 | —  | —  | 10 | —  | —  | 20 | —  | —  | —  | —  |
| G9  | 70 | 10 | —  | —  | 15 | —  | —  | 5  | —  | —  | —  | —  |
| G10 | 35 | 2  | —  | —  | 15 | —  | —  | —  | 48 | —  | —  | —  |
| G11 | 32 | 5  | —  | —  | 15 | —  | —  | —  | 48 | —  | —  | —  |
| G12 | 15 | 40 | —  | —  | 5  | —  | —  | —  | —  | —  | 40 | —  |
| G13 | 10 | 50 | —  | —  | 5  | —  | —  | —  | —  | —  | 35 | —  |
| G14 | 20 | 20 | 10 | —  | 10 | —  | —  | —  | —  | 40 | —  | —  |
| G15 | 15 | 15 | 30 | —  | 10 | —  | —  | 30 | —  | —  | —  | —  |
| G16 | 15 | 10 | 40 | —  | 5  | —  | —  | 30 | —  | —  | —  | —  |
| G17 | 20 | 20 | —  | —  | 20 | —  | —  | —  | —  | 40 | —  | —  |
| G18 | 25 | 20 | —  | —  | —  | 10 | —  | —  | —  | —  | —  | 45 |
| G19 | 20 | 20 | —  | —  | —  | 20 | —  | —  | —  | —  | —  | 40 |
| G20 | 27 | 22 | —  | —  | 3  | 3  | —  | —  | —  | 45 | —  | —  |

Numbers in the table are in wt %

TABLE 2

| Glass # | $SiO_2$ | $B_2O_3$ | $Al_2O_3$ | Alkali metal oxide ||| | Alkaline earth oxide ||| MgO | ZnO |
| --- | --- | --- | --- | --- | --- | --- | --- | --- | --- | --- | --- | --- |
| | | | | $K_2O$ | $Li_2O$ | $Na_2O$ | PbO | BaO | SrO | CaO | | |
| G21 | 40 | 35 | —  | —  | 10 | —  | —  | —  | —  | 15 | —  | —  |
| G22 | 40 | 30 | —  | —  | 10 | —  | —  | —  | —  | 20 | —  | —  |
| G23 | 15 | 10 | —  | —  | 5  | —  | —  | —  | —  | 70 | —  | —  |
| G24 | 10 | 10 | —  | —  | —  | —  | —  | —  | —  | 80 | —  | —  |
| G25 | 15 | 10 | —  | —  | 5  | —  | —  | 70 | —  | —  | —  | —  |
| G26 | 10 | 10 | —  | —  | —  | —  | —  | 80 | —  | —  | —  | —  |
| G27 | 40 | 40 | —  | —  | 10 | —  | —  | —  | 10 | —  | —  | —  |
| G28 | 35 | 35 | —  | —  | 10 | —  | —  | —  | 20 | —  | —  | —  |
| G29 | 40 | 40 | —  | —  | 10 | —  | —  | —  | —  | —  | 10 | —  |
| G30 | 35 | 35 | —  | —  | 10 | —  | —  | —  | —  | —  | 20 | —  |
| G31 | 15 | 10 | —  | —  | 5  | —  | —  | —  | —  | —  | —  | 70 |
| G32 | 10 | 10 | —  | —  | —  | —  | —  | —  | —  | —  | —  | 80 |
| G33 | 27 | 23 | —  | —  | 5  | —  | —  | —  | —  | 25 | —  | 20 |
| G34 | 40 | 40 | —  | —  | 10 | —  | —  | —  | —  | 5  | —  | 5  |
| G35 | 35 | 35 | —  | —  | 10 | —  | —  | —  | —  | 10 | —  | 10 |

Numbers in the table are in wt %.

In the meantime, as starting materials for the dielectric ceramic component, $BaCO_3$, ZnO, $Co_3O_4$, $Nb_2O_5$, and $CeO_2$ were prepared, these starting materials were mixed so as to be mixtures having compositions of the dielectric ceramic components shown in Tables 3 to 5 below. Then, after wet-mixing the mixtures thus formed using a ball mill for 16 hours, the mixtures were dehydrated and then dried, whereby the baked mixtures as the starting materials for the dielectric ceramic components were prepared after heat treatment thereof at 1,000° C. for 2 hours.

Subsequently, the powdered glasses represented by the glass numbers G1 to G35 were added to 100 parts by weight the resultant baked mixtures so that addition amounts of the powdered glasses were as shown in Tables 3 to 5 below. In addition, after adding an organic binder, a plasticizer, and the like to the glass ceramic mixtures thus obtained, the mixtures were again wet-pulverized using a ball mill for 16 hours, thereby obtaining slurries for the dielectric ceramic compositions.

After pressing the slurries for the dielectric ceramic compositions at 2,000 kgf/cm² so as to form disks 10 mm in diameter and 5 mm thick after baking, the disks thus formed were baked at temperatures shown in Tables 6 to 8 for 2 hours, thereby obtaining dielectric ceramic compositions represented by sample numbers 1 to 63 in Tables 3 to 5 below.

TABLE 3

| Sample # | Dielectric ceramic component $Ba\{(Co_xZn_{1-x})_yNb_{1-y}\}_zO_w$ | | | $CeO_2$ addition amount (wt %) | Glass component | |
|---|---|---|---|---|---|---|
| | x | y | z | | Glass # | Addition amount (wt %) |
| 1 | 1.0 | 0.327 | 0.955 | 0 | G1 | 1 |
| 2 | 0.0 | 0.323 | 0.993 | 0 | G1 | 10 |
| 3 | 0.0 | 0.323 | 0.993 | 0 | G1 | 25 |
| 4 | 0.5 | 0.310 | 0.955 | 0 | G1 | 1 |
| 5 | 0.5 | 0.310 | 0.955 | 0 | G1 | 5 |
| 6 | 0.7 | 0.333 | 0.995 | 0 | G1 | 1 |
| 7 | 0.5 | 0.327 | 0.990 | 0 | G4 | 10 |
| 8 | 0.5 | 0.327 | 0.990 | 0 | G4 | 25 |
| 9 | 0.7 | 0.327 | 1.000 | 0 | G4 | 1 |
| 10 | 0.9 | 0.327 | 0.997 | 0 | G1 | 5 |
| 11 | 0.5 | 0.327 | 0.997 | 0 | G1 | 5 |
| 12 | 0.1 | 0.327 | 0.997 | 0 | G1 | 5 |
| 13 | 0.7 | 0.313 | 0.997 | 0 | G4 | 5 |
| 14 | 0.7 | 0.330 | 0.997 | 0 | G4 | 10 |
| 15 | 0.7 | 0.327 | 0.998 | 0 | G4 | 5 |
| 16 | 0.7 | 0.327 | 0.993 | 0 | G1 | 5 |
| 17 | 0.7 | 0.327 | 0.997 | 0 | G1 | 0.05 |
| 18 | 0.7 | 0.327 | 0.997 | 0 | G1 | 1 |
| 19 | 0.7 | 0.327 | 0.997 | 0 | G1 | 10 |
| 20 | 0.7 | 0.327 | 0.997 | 0 | G1 | 25 |
| 21 | 0.7 | 0.327 | 0.997 | 0 | G1 | 40 |
| 22 | 0.7 | 0.327 | 0.997 | 0 | G2 | 25 |
| 23 | 0.7 | 0.327 | 0.997 | 0 | G2 | 40 |
| 24 | 0.7 | 0.327 | 0.997 | 0 | G3 | 25 |
| 25 | 0.7 | 0.327 | 0.997 | 0 | G3 | 40 |

TABLE 4

| Sample # | Dielectric ceramic component $Ba\{(Co_xZn_{1-x})_yNb_{1-y}\}_zO_w$ | | | $CeO_2$ addition amount (wt %) | Glass component | |
|---|---|---|---|---|---|---|
| | x | y | z | | Glass # | Addition amount (wt %) |
| 26 | 0.7 | 0.327 | 0.997 | 0 | G5 | 0.05 |
| 27 | 0.7 | 0.327 | 0.997 | 0 | G5 | 1 |
| 28 | 0.5 | 0.321 | 0.993 | 0 | G4 | 5 |
| 29 | 0.5 | 0.321 | 0.993 | 0.01 | G4 | 5 |
| 30 | 0.5 | 0.321 | 0.993 | 0.1 | G4 | 5 |
| 31 | 0.5 | 0.321 | 0.993 | 0.2 | G4 | 5 |
| 32 | 0.5 | 0.321 | 0.993 | 0.5 | G4 | 5 |
| 33 | 0.5 | 0.321 | 0.993 | 0.8 | G4 | 5 |
| 34 | 0.5 | 0.321 | 0.993 | 0 | G1 | 5 |
| 35 | 0.5 | 0.321 | 0.993 | 0 | G6 | 5 |
| 36 | 0.5 | 0.321 | 0.993 | 0 | G7 | 5 |
| 37 | 0.5 | 0.321 | 0.993 | 0 | G8 | 5 |
| 38 | 0.5 | 0.321 | 0.993 | 0 | G9 | 5 |
| 39 | 0.5 | 0.321 | 0.993 | 0 | G10 | 5 |
| 40 | 0.5 | 0.321 | 0.993 | 0 | G11 | 5 |
| 41 | 0.5 | 0.321 | 0.993 | 0 | G12 | 5 |
| 42 | 0.5 | 0.321 | 0.993 | 0 | G13 | 5 |
| 43 | 0.5 | 0.321 | 0.993 | 0 | G14 | 5 |
| 44 | 0.5 | 0.321 | 0.993 | 0 | G15 | 5 |
| 45 | 0.5 | 0.321 | 0.993 | 0 | G16 | 5 |
| 46 | 0.5 | 0.321 | 0.993 | 0 | G17 | 5 |
| 47 | 0.5 | 0.321 | 0.993 | 0 | G18 | 5 |
| 48 | 0.5 | 0.321 | 0.993 | 0 | G19 | 5 |
| 49 | 0.5 | 0.321 | 0.993 | 0 | G20 | 5 |
| 50 | 0.5 | 0.321 | 0.993 | 0 | G21 | 5 |

TABLE 5

| | Dielectric ceramic component Ba{(Co$_x$Zn$_{1-x}$)$_y$Nb$_{1-y}$}$_z$O$_w$ | | | | Glass component | |
|---|---|---|---|---|---|---|
| Sample # | x | y | z | CeO$_2$ addition amount (wt %) | Glass # | Addition amount (wt %) |
| 51 | 0.5 | 0.321 | 0.993 | 0 | G22 | 5 |
| 52 | 0.5 | 0.321 | 0.993 | 0 | G23 | 5 |
| 53 | 0.5 | 0.321 | 0.993 | 0 | G24 | 5 |
| 54 | 0.5 | 0.321 | 0.993 | 0 | G25 | 5 |
| 55 | 0.5 | 0.321 | 0.993 | 0 | G26 | 5 |
| 56 | 0.5 | 0.321 | 0.993 | 0 | G27 | 5 |
| 57 | 0.5 | 0.321 | 0.993 | 0 | G28 | 5 |
| 58 | 0.5 | 0.321 | 0.993 | 0 | G29 | 5 |
| 59 | 0.5 | 0.321 | 0.993 | 0 | G30 | 5 |
| 60 | 0.5 | 0.321 | 0.993 | 0 | G31 | 5 |
| 61 | 0.5 | 0.321 | 0.993 | 0 | G33 | 5 |
| 62 | 0.5 | 0.321 | 0.993 | 0 | G34 | 5 |
| 63 | 0.5 | 0.321 | 0.993 | 0 | G35 | 5 |

Relative dielectric constants ($\in$r) and Q values at a resonant frequency of approximately 7 GHz were respectively measured for the dielectric ceramic compositions of the sample numbers 1 to 63 by a dielectric resonant method (short-circuited at both ends of a dielectric resonator), i.e., a Hakki & Coleman method. The results of relative dielectric constants and Q values together with associated sintering temperatures are shown in Tables 6 to 8.

TABLE 6

| Sample # | Sintering temperature (° C.) | Relative dielectric constant | Q value | Remarks |
|---|---|---|---|---|
| 1 | 1,000 | 32 | 300 | |
| 2 | 1,100 | — | — | unsintered |
| 3 | 1,100 | 33 | 200 | |
| 4 | 1,100 | — | — | unsintered |
| 5 | 1,100 | 31 | 600 | |
| 6 | 1,100 | 32 | 400 | |
| 7 | 1,100 | — | — | unsintered |
| 8 | 1,100 | 27 | 350 | |
| 9 | 1,000 | 32 | 600 | |
| 10 | 1,100 | 29 | 1,400 | |
| 11 | 1,000 | 31 | 2,300 | |
| 12 | 1,000 | 35 | 1,800 | |
| 13 | 1,100 | 30 | 2,100 | |

TABLE 6-continued

| Sample # | Sintering temperature (° C.) | Relative dielectric constant | Q value | Remarks |
|---|---|---|---|---|
| 14 | 1,000 | 28 | 1,900 | |
| 15 | 1,000 | 31 | 1,800 | |
| 16 | 900 | 30 | 1,800 | |
| 17 | 1,100 | — | — | slightly poor sintering characteristics |
| 18 | 1,100 | 32 | 2,500 | |
| 19 | 1,000 | 29 | 2,500 | |
| 20 | 900 | 26 | 1,900 | |
| 21 | 900 | 22 | 600 | |
| 22 | >1,000 | 27 | 1,000 | high sintering temperature |
| 23 | 1,100 | 22 | 200 | |
| 24 | >1,000 | 25 | 1,000 | high sintering temperature |
| 25 | 1,100 | 22 | 100 | |

TABLE 7

| Sample # | Sintering temperature (° C.) | Relative dielectric constant | Q value | Remarks |
|---|---|---|---|---|
| 26 | 1,100 | — | — | unsintered |
| 27 | 1,100 | 32 | 800 | |
| 28 | 1,000 | 30 | 3,000 | |
| 29 | 1,000 | 30 | 3,000 | |
| 30 | 1,000 | 30 | 3,200 | |
| 31 | 1,000 | 30 | 4,000 | |
| 32 | 1,000 | 30 | 3,100 | |
| 33 | 1,000 | 30 | 800 | |
| 34 | 1,000 | 26 | 2,000 | |
| 35 | 1,000 | 32 | 1,200 | slightly poor in humidity resistance |
| 36 | 1,000 | 31 | 2,000 | |
| 37 | 1,000 | 27 | 2,400 | |
| 38 | 1,100 | 27 | 2,100 | slightly high sintering temperature |
| 39 | 1,100 | 29 | 2,200 | slightly high sintering temperature |
| 40 | 1,000 | 28 | 2,000 | |
| 41 | 1,000 | 31 | 2,500 | |

TABLE 7-continued

| Sample # | Sintering temperature (° C.) | Relative dielectric constant | Q value | Remarks |
|---|---|---|---|---|
| 42 | 1,000 | 30 | 1,900 | slightly poor in humidity resistance |
| 43 | 1,000 | 29 | 2,800 | |
| 44 | 1,000 | 29 | 2,500 | |
| 45 | 1,100 | 29 | 2,000 | slightly high sintering temperature |
| 46 | 1,000 | 32 | 1,200 | slightly poor in humidity resistance |
| 47 | 1,000 | 29 | 3,000 | |
| 48 | 1,000 | 32 | 1,000 | slightly poor in humidity resistance |
| 49 | 1,000 | 30 | 3,300 | |
| 50 | 1,100 | 29 | 2,500 | slightly high sintering temperature |

TABLE 8

| Sample # | Sintering temperature (° C.) | Relative dielectric constant | Q value | Remarks |
|---|---|---|---|---|
| 51 | 1,000 | 29 | 2,900 | |
| 52 | 1,000 | 31 | 1,900 | |
| 53 | 1,000 | 32 | 2,000 | slightly poor in humidity resistance |
| 54 | 1,000 | 32 | 1,500 | |
| 55 | 1,000 | 33 | 800 | slightly poor in humidity resistance |
| 56 | 1,100 | 29 | 3,500 | slightly high sintering temperature |
| 57 | 1,000 | 29 | 2,500 | |
| 58 | 1,100 | 27 | 3,000 | slightly high sintering temperature |
| 59 | 1,000 | 27 | 2,800 | |
| 60 | 1,000 | 31 | 2,000 | |
| 61 | 1,000 | 31 | 3,200 | |
| 62 | 1,100 | 29 | 3,000 | slightly high sintering temperature |
| 63 | 1,000 | 27 | 2,500 | |

The dielectric ceramic compositions of sample numbers 10 to 21, and 28 to 63 were represented by the general formula $Ba\{(Co_xZn_{1-x})_yNb_{1-y}\}_zO_w$, in which, on a molar basis, $0<x<1$, $0.313 \leq y \leq 0.333$, $0.993 \leq z<1$, and $x+y+z=1$. In addition, glass added to the dielectric ceramic compositions was $SiO_2$—$B_2O_3$-based glass. These dielectric ceramic compositions were sinterable at a low temperature of not less than 1,100° C., and have high relative dielectric constants and high Q values in a high frequency region.

In the dielectric ceramic composition of sample number 21, since the added amount of $SiO_2$—$B_2O_3$-based glass component exceeded 25 parts by weight to 100 parts by weight of the dielectric ceramic component, the relative dielectric constant and the Q value tended to decrease. In the dielectric ceramic composition of sample number 17, since the added amount of $SiO_2$—$B_2O_3$-based glass component was less than 1 part by weight, it is difficult to perform sintering at 1,100° C. or less to form a dense sintered compact. In particular, as can be seen from the results for sample numbers 17 to 21, the content of the $SiO_2$—$B_2O_3$-based glass component was preferably 1 to 25 parts by weight to 100 parts by weight of the dielectric ceramic composition in terms of the high dielectric constant and the high Q value.

In the meantime, the dielectric ceramic compositions of sample numbers 22 to 27 did not have $SiO_2$ or $B_2O_3$ therein, and as a result, the sintering temperatures were high, or the Q values of the dielectric ceramic compositions significantly decreased.

Concerning the $SiO_2$—$B_2O_3$-based glass component, in the dielectric ceramic composition of sample number 35 having the $SiO_2$ content of less than 10 percent by weight, the Q value tended to decrease in addition to the decrease in humidity resistance to some extent. On the other hand, when the $SiO_2$ content exceeded 60 percent by weight, as can be seen in the dielectric ceramic composition of sample number 38, the sintering temperature tended to increase.

In addition, concerning the $SiO_2$—$B_2O_3$-based glass component, in the dielectric ceramic composition of sample number 39 having the $B_2O_3$ content of less than 5 percent by weight, the sintering temperature increased to some extent, and as a result, the sintering characteristics tended to be degraded. On the other hand, in the dielectric ceramic composition of sample number 42 having the $B_2O_3$ content more than 40 percent by weight, the humidity resistance decreased to some extent.

As can be seen in the dielectric ceramic composition of sample number 36, the $SiO_2$—$B_2O_3$-based glass component may not include $Al_2O_3$ at all. However, in the dielectric ceramic composition of sample number 45 having the $Al_2O_3$ content of more than 30 percent by weight, the sintering characteristics tended to be degraded to some extent.

In the $SiO_2$—$B_2O_3$-based glass component, when the content of alkaline earth oxide (MgO, CaO, SrO, and BaO) and/or zinc oxide (ZnO) is less than 20 percent by weight, as can be seen in the dielectric ceramic compositions of sample numbers 50, 56, 58, and 62, tile sintering temperature tended to increase to some extent. On the other hand, in the dielectric ceramic composition of sample numbers 53 and 55 having the content of more than 70 percent by weight, the humidity resistance decreased to some extent, and the Q value tended to decrease. In particular, when the content of alkaline earth oxide and/or zinc oxide is too high, as can be seen in glass number G32, the dielectric ceramic composition formed thereof could not be vitrified.

In addition, concerning an alkali metal oxide ($Li_2O$, $Na_2O$, and $K_2O$) in the $SiO_2$—$B_2O_3$-based glass component, in the dielectric ceramic compositions of sample numbers 46 and 48 having the content of more than 15 percent by weight, the humidity resistance tended to decrease to some extent and the Q value tended to decrease.

In the dielectric ceramic component represented by the general formula $Ba\{(Co_xZn_{1-x})_yNb_{1-y}\}_zO_w$, when the x is 0 or 1 on a molar basis as in the dielectric ceramic compositions of sample numbers 1 to 3, sintering at 1,100° C. or less could not be performed, or even if sintering at 1,100° C. or less could be performed, the Q value significantly decreased. When the $y<0.313$ or $y \geq 0.333$ on a molar basis as in the dielectric ceramic compositions of sample numbers 4 to 6, sintering at 1,100° C. or less could not be performed, or the Q value significantly decreased. In addition, when the $z<0.993$ or $z=1$ on a molar basis as in the dielectric ceramic compositions of sample numbers 7 to 9, similarly to the above, sintering at 1,100° C. or less could not also be performed, or the Q value significantly decreased.

Since the dielectric ceramic composition of the present invention comprises the dielectric ceramic component represented by the general formula $Ba\{(Co_xZn_{1-x})_yNb_{1-y}\}_zO_w$ and the $SiO_2$—$B_2O_3$-based glass component mixed therewith, the high relative dielectric constant, the small temperature coefficient of resonant frequency, and the high Q valued in a high frequency region of the dielectric ceramic component can be maintained. In addition, the dielectric ceramic composition having superior electrical and temperature characteristics thus described can be sintered at a low temperature not greater than the melting point of a low melting point metal.

In the ceramic electronic device of the present invention having the conductive layer and the dielectric layer, the dielectric layer is composed of the dielectric ceramic composition of the present invention, and as a result, the dielectric layer can be simultaneously baked with a low melting point metal having low resistivity, such as silver or copper. Accordingly, the ceramic electronic device having superior electrical and temperature characteristics, and more specifically, having superior high frequency characteristics in a high frequency region, can be obtained.

Although embodiments of the invention have been disclosed herein, the invention is not limited to those embodiments, but extends to all modifications, variations, equivalents and other uses that would occur to those having the ordinary level of skill in the art.

What is claimed is:

1. A dielectric ceramic composition comprising:
   a dielectric ceramic component represented by the general formula $Ba\{(Co_xZn_{1-x})_yNb_{1-y}\}_zO_w$, in which, on a molar basis, $0<x<1$, $0.313 \leq y<0.333$, $0.993 \leq z<1$, and w is the molar proportion of oxygen in the ceramic component; and
   a glass component comprising at least silicon oxide and boron oxide.

2. A dielectric ceramic composition according to claim 1, wherein 1 to 25 parts by weight of the glass component is mixed with 100 parts by weight of the dielectric ceramic component.

3. A dielectric ceramic composition according to claim 2, further comprising cerium oxide at a ratio of not more than 0.5 part by weight of the cerium oxide to 100 parts by weight of the dielectric ceramic component.

4. A dielectric ceramic composition according to claim 2, wherein the glass component comprises 10 to 60 percent by weight of silicon oxide, 5 to 40 percent by weight of boron oxide, 0 to 30 percent by weight of aluminum oxide, 20 to 70 percent by weight of at least one of an alkaline earth metal oxide and zinc oxide, and 0 to 15 percent by weight of an alkali metal oxide.

5. A dielectric ceramic composition according to claim 4, further comprising cerium oxide at a ratio of not more than 0.5 part by weight of the cerium oxide to 100 parts by weight of the dielectric ceramic component.

6. A dielectric ceramic composition according to claim 1, further comprising cerium oxide at a ratio of not more than 0.5 part by weight of the cerium oxide to 100 parts by weight of the dielectric ceramic component.

7. A dielectric ceramic composition according to claim 1, wherein the glass component comprises 10 to 60 percent by weight of silicon oxide, 5 to 40 percent by weight of boron oxide, 0 to 30 percent by weight of aluminum oxide, 20 to 70 percent by weight of at least one of an alkaline earth metal oxide and zinc oxide, and 0 to 15 percent by weight of an alkali metal oxide.

8. A dielectric ceramic composition according to claim 7, further comprising cerium oxide at a ratio of not more than 0.5 part by weight of the cerium oxide to 100 parts by weight of the dielectric ceramic component.

9. A ceramic electronic device comprising a dielectric layer and a conductive layer provided thereon, wherein the dielectric layer comprises a dielectric ceramic composition comprising:
   a dielectric ceramic component represented by the general formula $Ba\{(Co_xZn_{1-x})_yNb_{1-y}\}_zO_w$, in which, on a molar basis, $0<x<1$, $0.313 \leq y \leq 0.333$, $0.993 \leq z<1$, and w is the molar proportion of oxygen in the ceramic component; and
   a glass component comprising at least silicon oxide and boron oxide.

10. A ceramic electronic device according to claim 9, wherein the conductive layer comprises at least one conductive material selected from the group consisting of a copper-based conductive material, a silver-based conductive material, and a gold-based conductive material.

11. A ceramic electronic device according to claim 9, wherein 1 to 25 parts by weight of the glass component is mixed with 100 parts by weight of the dielectric ceramic component.

12. A ceramic electronic device according to claim 11, further comprising cerium oxide at a ratio of not more than 0.5 part by weight of the cerium oxide to 100 part by weight of the dielectric ceramic component.

13. A ceramic electronic device according to claim 11, wherein the glass component comprises 10 to 60 percent by weight of silicon oxide, 5 to 40 percent by weight of boron oxide, 0 to 30 percent by weight of aluminum oxide, 20 to 70 percent by weight of at least one of an alkaline earth metal oxide and zinc oxide, and 0 to 15 percent by weight of an alkali metal oxide.

14. A ceramic electronic device according to claim 13, further comprising cerium oxide at a ratio of not more than 0.5 part by weight of the cerium oxide to 100 parts by weight of the dielectric ceramic component.

15. A ceramic electronic device according to claim 9, further comprising cerium oxide at a ratio of not more than 0.5 part by weight of the cerium oxide to 100 parts by weight of the dielectric ceramic component.

16. A ceramic electronic device according to claim 9, wherein the glass component comprises 10 to 60 percent by weight of silicon oxide, 5 to 40 percent by weight of boron oxide, 0 to 30 percent by weight of aluminum oxide, 20 to 70 percent by weight of at least one of an alkaline earth metal oxide and zinc oxide, and 0 to 15 percent by weight of an alkali metal oxide.

17. A ceramic electronic device according to claim 16, further comprising cerium oxide at a ratio of not more than 0.5 part by weight of the cerium oxide to 100 parts by weight of the dielectric ceramic component.

* * * * *